US 6,708,312 B1

(12) United States Patent
Chiang et al.

(10) Patent No.: US 6,708,312 B1
(45) Date of Patent: Mar. 16, 2004

(54) METHOD FOR MULTI-THRESHOLD VOLTAGE CMOS PROCESS OPTIMIZATION

(75) Inventors: Ming-Mao Chiang, Hsinchu Hsien (TW); Ching-Chang Shih, Tainan Hsien (TW); Chin-Cho Tsai, Keelung (TW); Tien-Yueh Liu, Hsinchu (TW); Kuo-Chung Huang, Taoyuan Hsien (TW)

(73) Assignee: Silicon Integrated Systems Corp., Hsin Chu (TW)

( * ) Notice: Subject to any disclaimer, the term of this patent is extended or adjusted under 35 U.S.C. 154(b) by 12 days.

(21) Appl. No.: 10/225,284

(22) Filed: Aug. 22, 2002

(51) Int. Cl.[7] .............................................. A06F 17/50
(52) U.S. Cl. .................. 716/1; 716/4; 714/44; 326/36; 326/93; 327/408; 438/250; 438/262; 438/266; 438/302; 438/525
(58) Field of Search ................... 716/1, 4; 714/44; 438/250, 262, 266, 302, 525; 326/36; 327/93, 408

(56) References Cited

U.S. PATENT DOCUMENTS 5,774,367 A * 6/1998 Reyes et al. .................. 716/2
5,831,451 A * 11/1998 Bosshart ...................... 326/93
6,087,886 A * 7/2000 Ko .............................. 327/408
6,369,606 B1 * 4/2002 Houghton et al. ............ 326/36
6,458,666 B2 * 10/2002 Wasshuber ................. 438/302
6,620,679 B1 * 9/2003 Tzeng et al. ................ 438/250
2003/0101399 A1 * 5/2003 Yoshikawa .................. 714/774

* cited by examiner

Primary Examiner—Matthew Smith
Assistant Examiner—Sun James Lin
(74) Attorney, Agent, or Firm—Birch, Stewart, Kolasch & Birch, LLP

(57) ABSTRACT

A method for multi-threshold voltage CMOS process optimization. The method includes the steps of: providing a semiconductor substrate with a plurality of devices of different threshold voltages; establishing a plurality of types of timing models for a timing calculation; obtaining a static timing analysis report through the timing calculation; defining a large and a small setup time margin as a Tl and a Ts; changing the devices whose setup time margins are less than Ts to low threshold devices; changing the devices whose setup time margins are greater than Tl to high threshold devices; checking a setup time of each device; changing the devices whose setup time margin does not meet the enhanced static timing analysis report; performing a first pocket implant process for the normal threshold devices; performing a second pocket implant process for the low threshold devices and performing a third pocket implant process for the high threshold devices.

20 Claims, 8 Drawing Sheets

METHOD FOR MULTI-THRESHOLD VOLTAGE CMOS PROCESS OPTIMIZATION

BACKGROUND OF THE INVENTION

1. Field of the Invention

The present invention relates to the CMOS process, and more particularly to the design algorithm of the CMOS process.

2. Description of the Prior Art

The CMOS (Complementary Metal Oxide Semiconductor) circuit design has the advantage of low power compared with the BJT (Bipolar Junction Transistor), but has suffered from performance limitations. Because high speed digital design is requisite and designs with a gate count of more than ten millions are on the horizon, the process down sizing to 0.18 um/0.13 um or smaller scale is the trend for performance. However, the static and dynamic current consumption will increase rapidly due to faster devices. From the point of view of reducing power, the operation voltage is made as low as possible and the device threshold voltage is as large as possible. This, however, reduces the IC performance. Reducing the threshold voltage or increasing the saturation current will improve the delay time of the device. In other words, the device will transition from one stage to the other stage more quickly. However, this method will increase the switching current and reduce the noise margin, meaning that the power consumption will become larger.

In FIG. 1, a basic MOS structure is formed on a semiconductor substrate 10. The MOS structure includes a gate 12, a gate oxide 14, spacers 16, offset spacers 18, pocket regions 20, HDD regions 22 and source/drain regions 24.

A conventional pocket implant process is shown in FIG. 2. In FIG. 2, two MOS devices are formed on a semiconductor substrate 50 and isolated by a shallow trench isolation 52. Each device includes a gate 56, a gate oxide 58 and a well region 54. The conventional pocket implant process with a normal dose density is performed to a predefined region of each device by covering other regions with a photoresistor 60.

Obtaining both reduction of power consumption and good performance will inevitably increase the price of the product. Thus, an algorithm that both obtains power and performance enhancement and prevents too many changes to the process recipes in CMOS design needs to be developed.

SUMMARY OF THE INVENTION

The object of the present invention is to solve the above-mentioned problems and to provide a method for multi-threshold voltage CMOS process optimization.

The present invention achieves the above-indicated object by providing a method for multi-threshold voltage CMOS process optimization comprising the steps of: providing a semiconductor substrate with a plurality of devices of different threshold voltages; establishing a plurality of types of timing models for a timing calculation, based on the plurality of devices of different threshold voltages; obtaining a static timing analysis (STA) report through the timing calculation; defining a large and a small setup time margin as a Tl and a Ts, based on the static timing analysis report; changing the devices whose setup time margin are less than Ts to low threshold devices and changing the devices whose setup time margin are greater than Tl to high threshold devices, such that an enhanced static timing analysis report is obtained; performing a first pocket implant process for the low threshold devices with a first dose density by covering the high threshold devices; performing a second pocket implant process for the high threshold devices with a second dose density, greater than the first dose density, by covering the low threshold devices.

BRIEF DESCRIPTION OF THE DRAWINGS

The present invention will be described in detail with reference to the illustrated embodiment and the accompanying drawings, in which.

DETAILED DESCRIPTION OF THE INVENTION

The present invention discloses how to use small process changes to achieve the greatest improvement of speed.

In most designs, the performance of the system is dominated by a few critical paths in the integrated circuit. It isn't necessary to enhance the speed of all of the devices in order to obtain a high performance system. In this regard, a method by changing the threshold voltage according to Static Timing Analysis (STA) report is disclosed.

Figure 1:
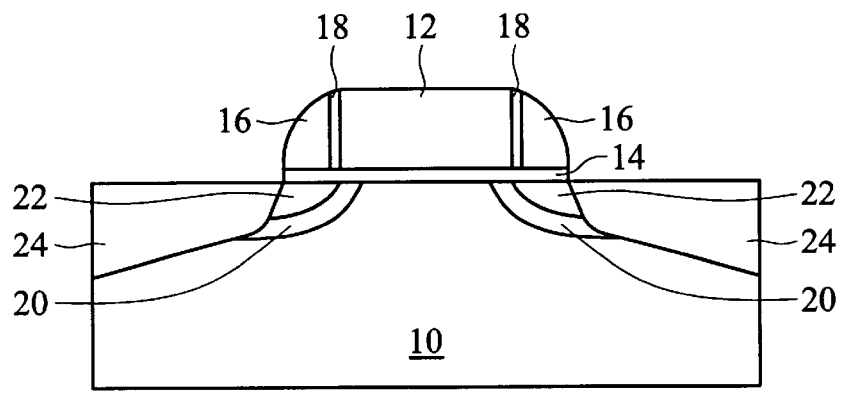
FIG. 1 is a basic MOS structure.
Figure 2:
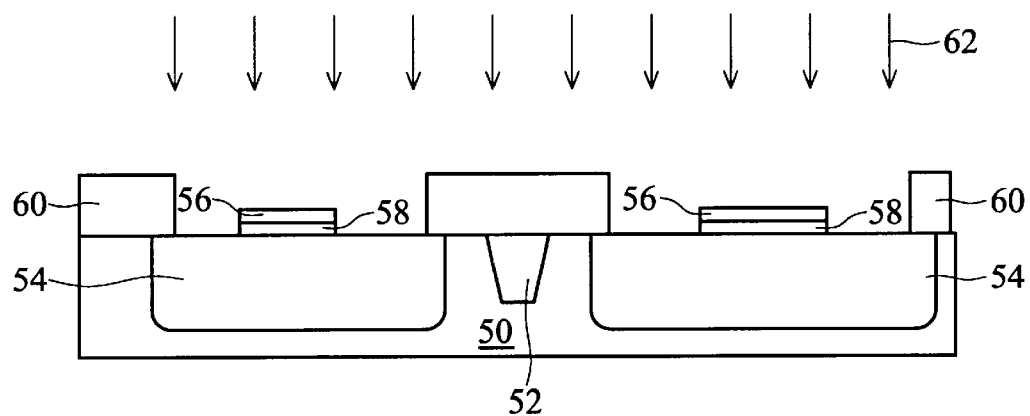
FIG. 2 is a conventional pocket implant process.
Figure 3:
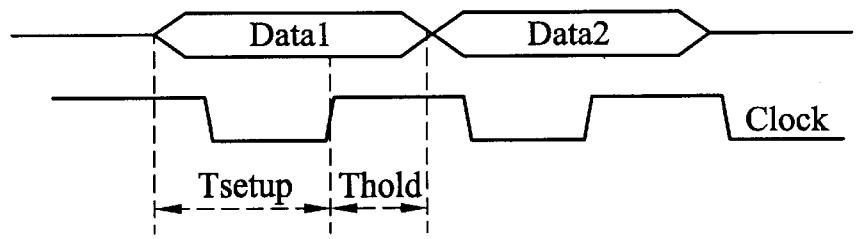
FIG. 3 is a timing chart showing the setup time and the hold time under different clock domain.

In the STA report, the setup time and the hold time under different clock domains, as shown in FIG. 3, need to be checked and the setup/hold time specification will be determined by the standard device timing. The timing calculation for the overall design based on the RC extraction result should be performed for the worst case and best case so the result is safe for the setup/hold time.

Figure 4:
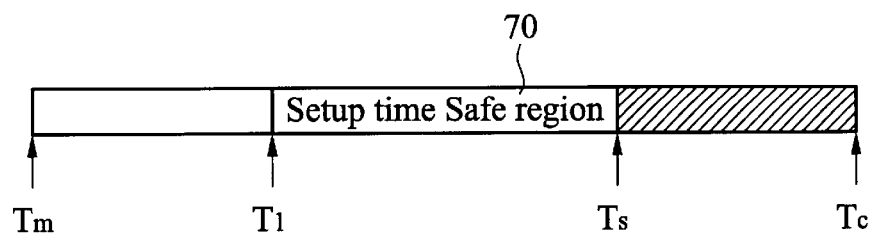
FIG. 4 is a setup timing region of the devices.

After finishing the static timing check, the worst case timing for the design can be guaranteed, and the setup timing can be arranged in order, as shown in FIG. 4. Then, Tl is defined as the timing paths that have large setup timing margin, Ts as the timing paths that have small setup timing margin, Tm as the timing path that has maximum setup timing margin and Tc as the timing path that has a setup timing margin criterion. If the devices in the timing paths are greater than Tl, they will be changed by higher threshold voltage devices. If the devices in the timing paths are smaller than Ts, they will be changed by lower threshold voltage devices. The result will centralize the timing window in the setup time safe region 70, and have the advantage of lower power consumption by replacing the device with timing paths greater than Tl and the advantage of the speed by replacing the device with timing paths smaller than Ts.

For increasing device speed, the general method is to change the saturation current. Using the saturation current equation described below, a scheme for increasing the current without adding RC loading can be obtained.

Figure 5:
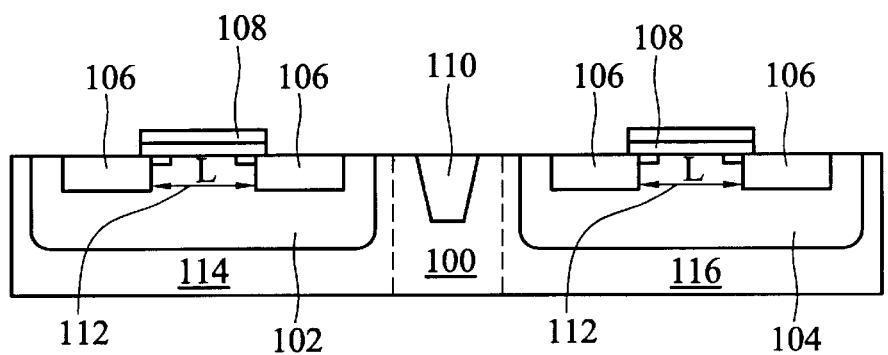
FIGS. 5 and 6 illustrate, in cross-section and in top view respectively, a CMOS structure.
Figure 6:
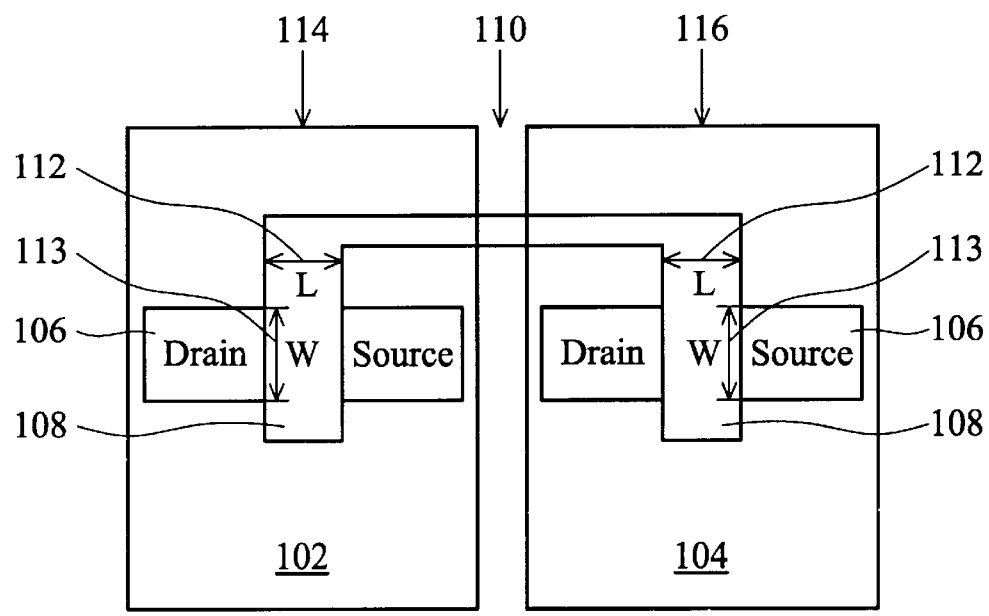

FIGS. 5 and 6 illustrate, in cross-section and in top view respectively, a CMOS structure. The CMOS structure is formed on a semiconductor substrate 100 and isolated by a shallow trench isolation 110. The CMOS structure includes a NMOS 114 and a PMOS 116. The NMOS includes a P-well 102, a gate 108 and source/drain regions 106. The PMOS includes a N-well 104, a gate 108 and source/drain regions 106. Numeral 112 represents a channel length and numeral 113 represents a channel width. The following is a saturation current of the CMOS.

$$Idsat \sim \tfrac{1}{2} \times \mu_n \times C_i \times (W/L) \times (V_G - V_T)^2$$

$\mu_n$: Carrier mobility
$C_i$: Gate Capacitance
W: Channel width
L: Channel length
$V_G$: Gate voltage
$V_T$: Threshold voltage
and $$V_T \sim +/- (2 \in qNd/C_i^2)^{1/2} \times V_B^{1/2}$$

$\in$: Substrate dielectric constant.
Nd: Dopant cocentration in well.
$C_i$: Gate capacitance.
$V_B$: Substrate bias effect (body effect).

From above equation, to increase Idsat without modifying physical dimension, changing VT is a good choice. There are three major methods to change VT.

1. Changing P-well (in NMOS) diffusion density.
2. Changing HDD (High Density Dopant) diffusion density (Idsat is sensitive to HDD).
3. Changing pocket diffusion density. In deep sub-micro process, VT is also sensitive to pocket.

Figure 7A:
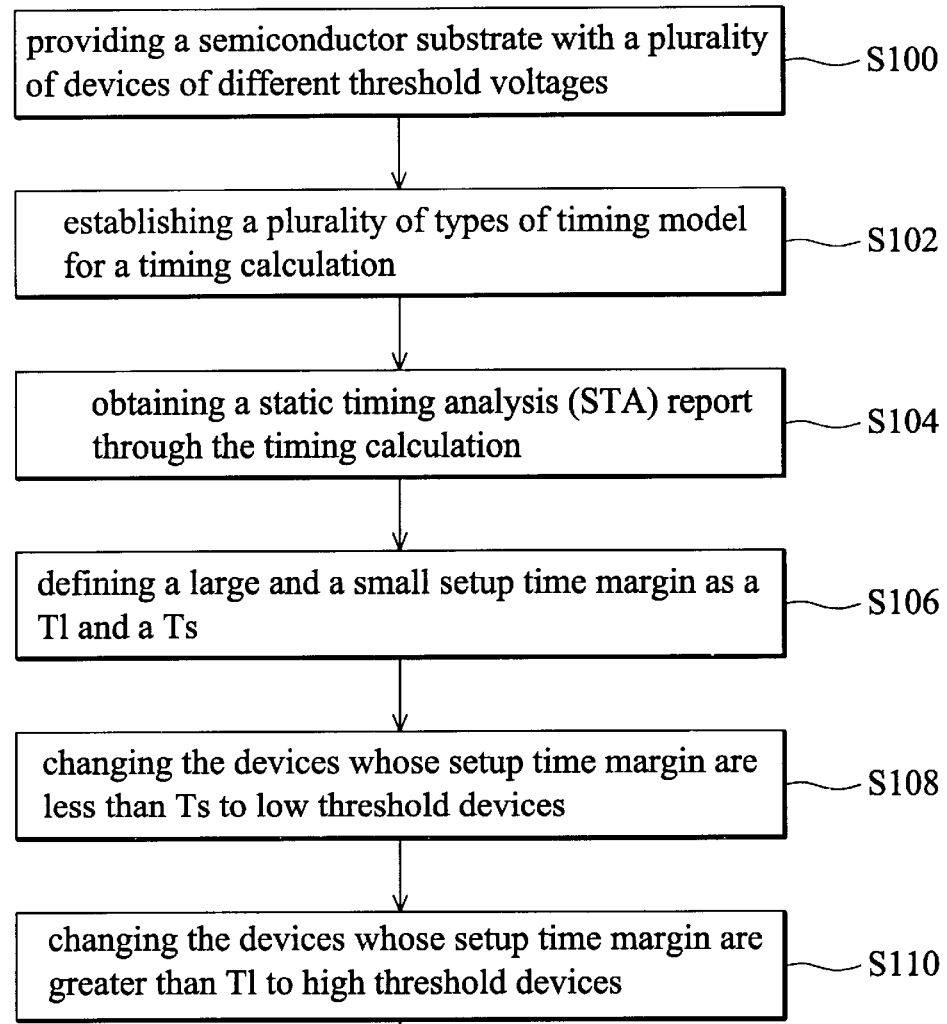
FIG. 7 is a flow chart showing the sequence of steps of multi-threshold voltage CMOS process optimization.
Figure 7B:
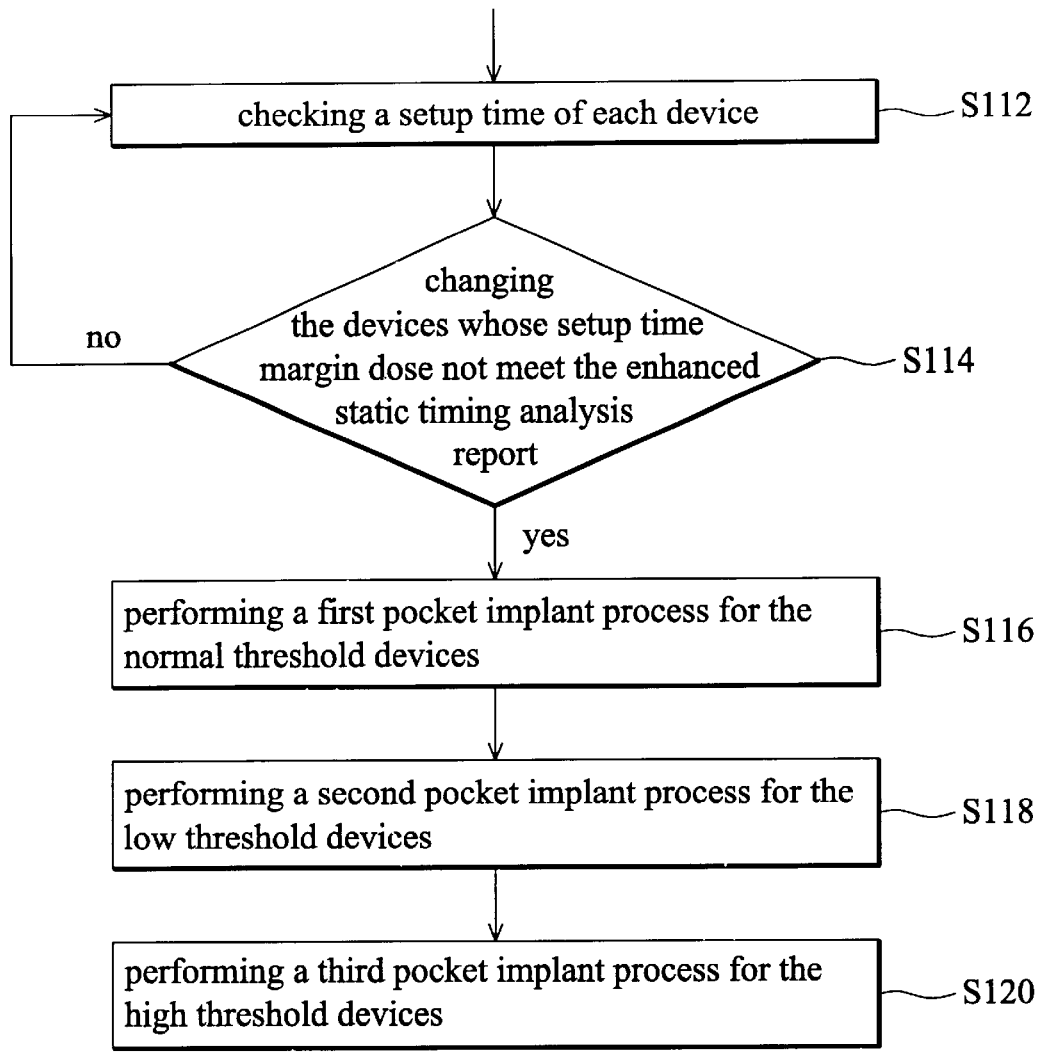

FIG. 7 is a flow chart showing the sequence of steps of multi-threshold voltage CMOS process optimization. In step S100, a semiconductor substrate with a plurality of devices of different threshold voltages is provided.

In step S102, based on multiple different threshold voltages, three types of timing model, such as "High", "Normal", "Low" for the timing calculation, are established.

In step S104, a STA result (setup/hold time) is reported, and then the devices that violate the timing constrains are changed or rerouted to solve the setup/hold time violation.

In step S106, the large/small setup time margin Tl and Ts are defined, based on the static timing analysis report.

In step S108, the devices whose setup time margins are less than Ts are changed to low threshold devices (high current).

In step S110, the devices whose setup time margins are greater than Tl are changed to high threshold devices (low current) while the remaining devices are normal threshold devices, such that a enhanced static timing analysis report is obtained.

In step S112, based on the enhanced STA report, setup/hold time is checked. The enhanced STA report is a description file based on the setup/hold time improvement obtained by changing the low threshold devices. Because the substitution of large setup time margin devices for the high threshold devices addresses power consumption concern, the report of the large setup time margin devices need not be changed.

In step S114, if the setup/hold time meets the enhanced STA report, the process is go to step S116; otherwise, the devices that violate the timing constrains are changed to normal devices, then go to step S112.

Figure 8:
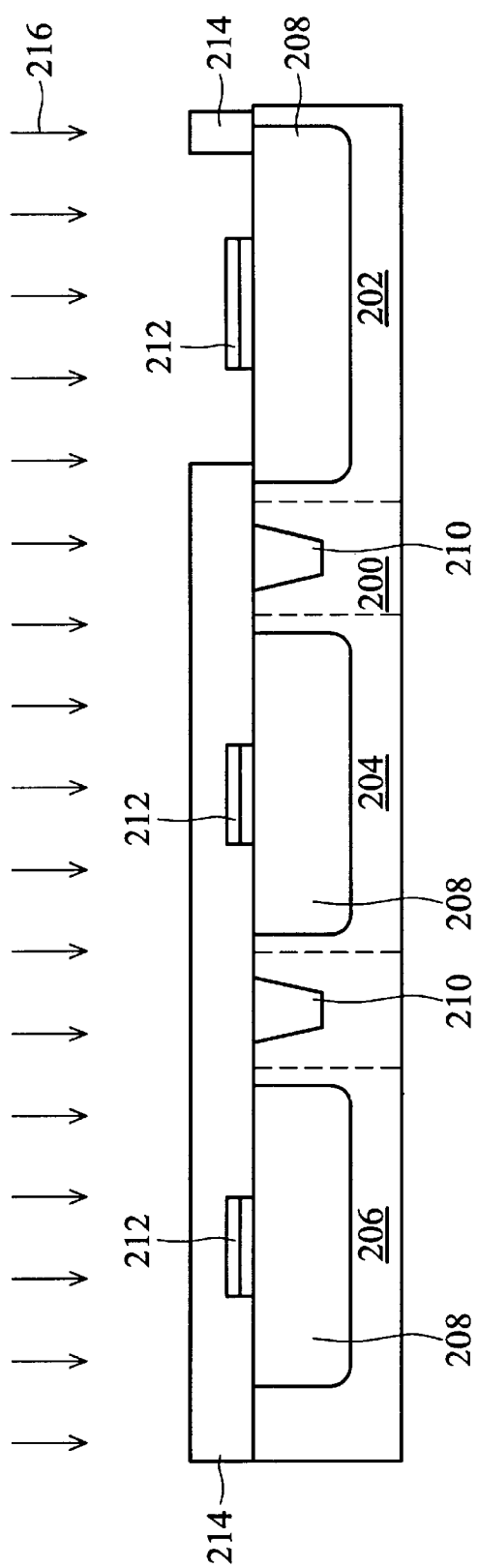
FIGS. 8 through 10 illustrate, in cross-section, the process in accordance with the present invention.
Figure 9:
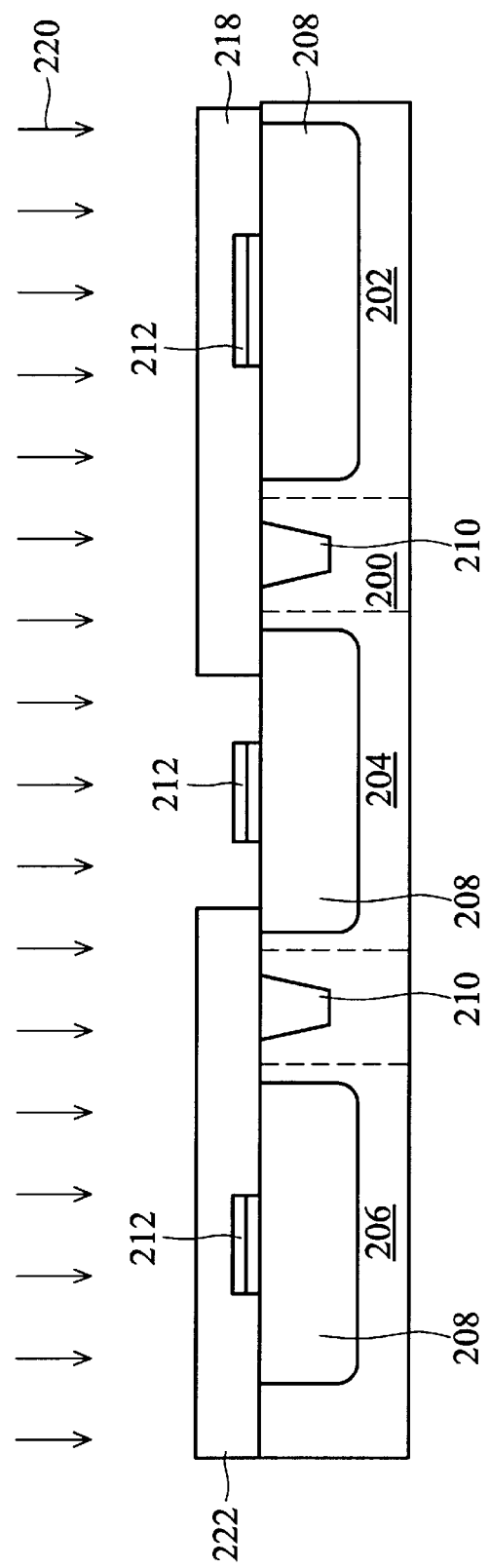
Figure 10:
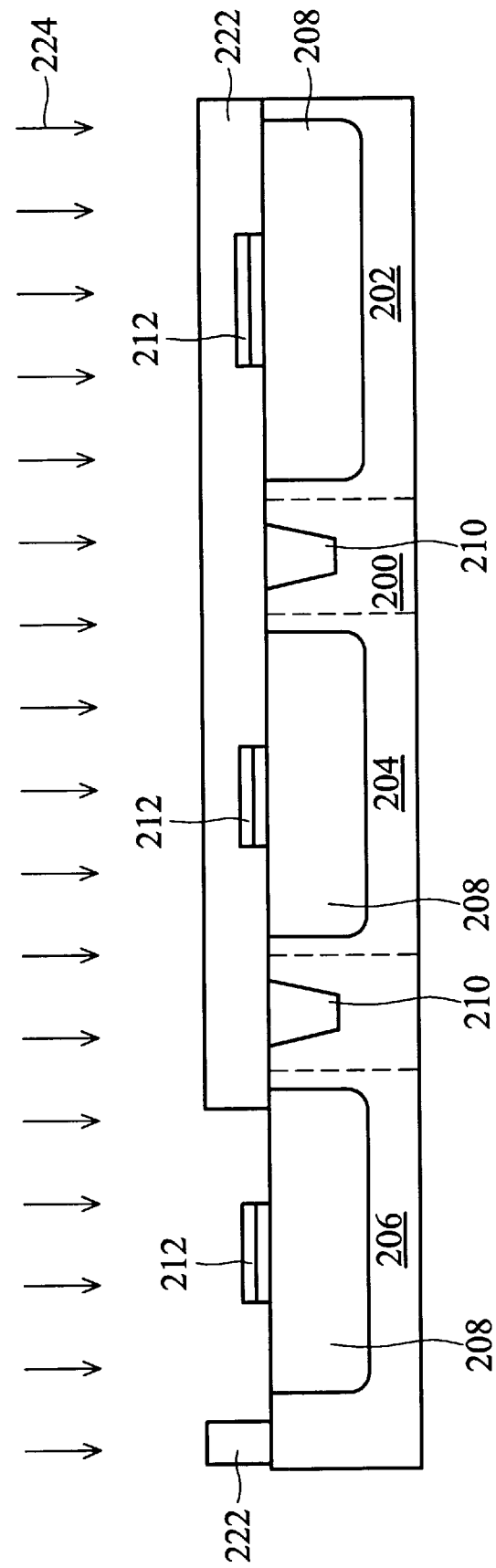

In step S116, a first pocket implant process 216 for the normal threshold devices 202 with a first dose density is performed by covering the low threshold devices 204 and high threshold devices 206 with a photoresistor 214, as shown in FIG. 8. Numeral 200 represents the substrate isolated by shallow trench isolations 210. Numeral 212 represents gates and numeral 208 represents well regions.

In step S118, a second pocket implant 220 process for the low threshold devices 204 with a second dose density, less than the first dose density, is performed by covering the normal threshold devices 202 and high threshold devices 206 with a photoresistor 218.

In step S120, a third pocket implant process 224 for the high threshold devices 206 with a third dose density, greater than the first dose density is performed, by covering the normal threshold devices 202 and low threshold devices 204.

While the present invention has been described with reference to three pocket implant processes, the description is not intended to be construed in a limiting sense. Two pocket implant processes of the various threshold devices, as well as other embodiments of the invention, will be apparent to those persons skilled in the art upon reference to this description.

The following is an experiment illustrating the multi-threshold optimization. Table 1 is the initial setup time data after STA in a normal procedure and the optimization result based on the multi-threshold optimization. It is obvious that the speed improvement of the flow is about 0.56~0.78 ns based on Ts=1.0 ns and 5 iterations. Table 2 is the high threshold algorithm results under a setting of Tl=3.5 ns, where there are a total of 20,917 devices changed to high threshold devices, so that, about 25% devices' power consumption of the chip is reduced. In a word, the setup time safe region is fall on the 0.57 ns to 3.5 ns based on the original criterion, and the present invention not only improves the speed of the system but also the power consumption of the chip.

TABLE 1

| Start Clock | Capture Clock | Threshold | After Change Device Timing Slack | Before Change Device Timing Slack | Improve |
| --- | --- | --- | --- | --- | --- |
| CLK1 | CLK1 | Low | 0.78 ns | 0.0 ns | 0.78 ns |
| CLK2 | CLK2 | Low | 0.79 ns | 0.05 ns | 0.74 ns |
| CLK3 | CLK3 | Low | 0.66 ns | 0.1 ns | 0.56 ns |
| CLK4 | CLK4 | Low | 0.57 ns | 0.0 ns | 0.57 ns |

TABLE 2

| Clock Domain | Threshold | After Optimization Normal device (No.) | Before Optimization Normal device (No.) | Change Device (No.) | Change Device Percentage |
| --- | --- | --- | --- | --- | --- |
| CLK1 | High | 20737 devices | 29825 devices | 9088 | 30.5% |
| CLK2 | High | 25412 devices | 32678 devices | 7266 | 22.2% |
| CLK3 | High | 8927 devices | 12003 devices | 3076 | 25.6% |
| CLK4 | High | 5233 devices | 6720 devices | 1487 | 22.1% |

It is to be understood that the present invention is not limited to the embodiments described above, but encompasses any and all embodiments within the scope of the following claims.

What is claimed is:

1. A method for multi-threshold voltage CMOS process optimization for a semiconductor substrate with a plurality of devices of different threshold voltages, comprising the steps of:

establishing a plurality of types of timing models for a timing calculation, based on the plurality of devices of different threshold voltages;

obtaining a static timing analysis (STA) report through the timing calculation;

defining a large and a small setup time margin as a Tl and a Ts, respectively, based on the static timing analysis report;

changing the devices whose setup time margins are less than Ts to low threshold devices and changing the devices whose setup time margin are greater than Tl to high threshold devices, such that an enhanced static timing analysis report is obtained;

performing a first pocket implant process for the low threshold devices with a first dose density by covering the high threshold devices; and performing a second pocket implant process for the high threshold devices with a second dose density, greater than the first dose density, by covering the low threshold devices.

2. The method as recited in claim 1, wherein after the step of obtaining the enhanced static timing analysis report, the following steps are performed:

checking a setup time of each device, based on the enhanced static timing analysis report; and changing the devices whose setup time margin does not meet the enhanced static timing analysis report to normal devices.

3. The method as recited in claim 1, wherein the Tl is between 1 and 2 nano second.

4. The method as recited in claim 1, wherein the Ts is between 0 and 1 nano second.

5. A method for multi-threshold voltage CMOS process optimization, comprising the steps of:

establishing a plurality of types of timing models for a timing calculation, based on a plurality of devices of different threshold voltages;

obtaining a static timing analysis (STA) report through the timing calculation;

defining a large and a small setup time margin as a Tl and a Ts, respectively, based on the static timing analysis report; and changing the devices whose setup time margin are less than Ts to low threshold devices and changing the devices whose setup time margins are greater than Tl to high threshold devices, such that an enhanced static timing analysis report is obtained.

6. The method as recited in claim 5, wherein after the step of obtaining the enhanced static timing analysis report, the following steps are performed:

checking a setup time of each device, based on the enhanced static timing analysis report; and changing the devices whose setup time margin does not meet the enhanced static timing analysis report to normal devices.

7. The method as recited in claim 5, wherein the Tl is between 1 and 2 nano second.

8. The method as recited in claim 5, wherein the Ts is between 0 and 1 nano second.

9. A method for multi-threshold voltage CMOS process optimization for a semiconductor substrate with a plurality of devices of different threshold voltages, comprising the steps of:

establishing a plurality of types of timing models for a timing calculation, based on the plurality of devices of different threshold voltages;

obtaining a static timing analysis (STA) report through the timing calculation;

defining a large and a small setup time margin as a Tl and a Ts, respectively, based on the static timing analysis report;

changing the devices whose setup time margins are less than Ts to low threshold devices and changing the devices whose setup time margins are greater than Tl to high threshold devices such that an enhanced static timing analysis report is obtained;

checking a setup time of each device, based on the enhanced static timing analysis report;

changing the devices whose setup time margin does not meet the enhanced static timing analysis report to the normal devices;

performing a first pocket implant process for the low threshold devices with a first dose density by covering the high threshold devices; and performing a second pocket implant process for the high threshold devices with a second dose density, greater than the first dose density, by covering the low threshold devices.

10. The method as recited in claim 9, wherein the Tl is between 1 and 2 nano second.

11. The method as recited in claim 9, wherein the Ts is between 0 and 1 nano second.

12. A method for multi-threshold voltage CMOS process optimization for a semiconductor substrate with a plurality of devices of different threshold voltages, comprising the steps of:

establishing a plurality of types of timing models for a timing calculation, based on the plurality of devices of different threshold voltages;

obtaining a static timing analysis (STA) report through the timing calculation;

defining a large and a small setup time margin as a Tl and a Ts, respectively, based on the static timing analysis report;

changing the devices whose setup time margins are less than Ts to low threshold devices and changing the devices whose setup time margins are greater than Tl to high threshold devices while the remaining devices are normal threshold devices, such that an enhanced static timing analysis report is obtained;

performing a first pocket implant process for the normal threshold devices with a first dose density by covering the low threshold devices and high threshold devices;

performing a second pocket implant process for the low threshold devices with a second dose density, less than the first dose density, by covering the normal threshold devices and high threshold devices; and performing a third pocket implant process for the high threshold devices with a third dose density, greater than the first dose density, by covering the normal threshold devices and low threshold devices.

13. The method as recited in claim 12, wherein after the step of obtaining the enhanced static timing analysis report, the following steps are performed:

checking a setup time of each device, based on the enhanced static timing analysis report; and changing the devices whose setup time margin does not meet the enhanced static timing analysis report to the normal devices.

14. The method as recited in claim 12, wherein the Tl is between 1 and 2 nano second.

15. The method as recited in claim 12, wherein the Ts is between 0 and 1 nano second.

16. A method for multi-threshold voltage CMOS process optimization, comprising the steps of:

establishing a plurality of types of timing models for a timing calculation, based on a plurality of devices of different threshold voltages;

obtaining a static timing analysis (STA) report through the timing calculation;

defining a large and a small setup time margin as a Tl and a Ts, respectively, based on the static timing analysis report; and changing the devices whose setup time margins are less than Ts to low threshold devices and changing the devices whose setup time margins are greater than Tl to high threshold devices while the remaining devices are normal threshold devices, such that an enhanced static timing analysis report is obtained.

17. The method as recited in claim 16, wherein after the step of obtaining the enhanced static timing analysis report, the following steps are performed:

checking a setup time of each device, based on the enhanced static timing analysis report; and changing the devices whose setup time margin does not meet the enhanced static timing analysis report to normal devices.

18. The method as recited in claim 16, wherein the Tl is between 1 and 2 nano second.

19. The method as recited in claim 16, wherein the Ts is between 0 and 1 nano second.

20. A method for multi-threshold voltage CMOS process optimization for a semiconductor substrate with a plurality of devices of different threshold voltages, comprising the steps of:

establishing a plurality of types of timing models for a timing calculation, based on the plurality of devices of different threshold voltages;

obtaining a static timing analysis (STA) report through the timing calculation;

defining a large and a small setup time margin as a Tl and a Ts, respectively, based on the static timing analysis report;

changing the devices whose setup time margins are less than Ts to low threshold devices and changing the devices whose setup time margins are greater than Tl to high threshold devices while the remaining devices are normal threshold devices, such that an enhanced static timing analysis report is obtained;

checking a setup time of each device, based on the enhanced static timing analysis report;

changing the devices whose setup time margin does not meet the enhanced static timing analysis report to the normal devices;

performing a first pocket implant process for the normal threshold devices with a first dose density by covering the low threshold devices and high threshold devices;

performing a second pocket implant process for the low threshold devices with a second dose density, less than the first dose density, by covering the normal threshold devices and high threshold devices; and performing a third pocket implant process for the high threshold devices with a third dose density, greater than the first dose density, by covering the normal threshold devices and low threshold devices.

* * * * *